(12) United States Patent
Steinrücke

(10) Patent No.: US 6,569,302 B1
(45) Date of Patent: May 27, 2003

(54) SUBSTRATE CARRIER

(75) Inventor: Andreas Steinrücke, Talheim (DE)

(73) Assignee: Steag Micro Tech GmbH (DE)

( * ) Notice: Subject to any disclaimer, the term of this patent is extended or adjusted under 35 U.S.C. 154(b) by 0 days.

(21) Appl. No.: 09/869,219

(22) PCT Filed: Dec. 15, 1999

(86) PCT No.: PCT/EP99/09942
§ 371 (c)(1),
(2), (4) Date: Nov. 7, 2001

(87) PCT Pub. No.: WO00/38222
PCT Pub. Date: Jun. 29, 2000

(30) Foreign Application Priority Data

Dec. 22, 1998 (DE) .......................... 198 59 467

(51) Int. Cl.[7] .............................................. C25D 17/04
(52) U.S. Cl. ........................ 204/297.1; 204/297.06; 204/297.07; 204/297.13; 204/297.14; 204/297.01; 204/286.1; 204/288.3; 204/288.4; 204/288.5
(58) Field of Search ................ 204/297.01, 297.06, 204/297.07, 297.1, 297.13, 297.14, 286.1, 287, 288.3, 288.4, 288.5

(56) References Cited

U.S. PATENT DOCUMENTS

| 5,421,401 A | 6/1995 | Sherstinsky et al. |
| 5,429,733 A | 7/1995 | Ishida |
| 5,447,615 A | 9/1995 | Ishida |
| 5,660,699 A | 8/1997 | Salto et al. |
| 6,248,222 B1 * | 6/2001 | Wang ................... 204/297.09 |

FOREIGN PATENT DOCUMENTS

| DE | 197 38 970 A1 | 8/1998 |
| WO | WO 94/05827 | 3/1994 |
| WO | WO 98/29704 | 7/1998 |

* cited by examiner

Primary Examiner—Bruce F. Bell
(74) Attorney, Agent, or Firm—R W Becker & Associates; R W Becker

(57) ABSTRACT

The invention relates to a substrate carrier for holding substrates, especially semiconductor wafers. Good sealing of the wafer surface and electrical contact are made possible in that the substrate carrier has a first and a second part having a central opening matching the form of the substrate, wherein the substrate is received between the first and the second part and a peripheral seal having at least one undercut is provided in the inner periphery of the second part.

41 Claims, 3 Drawing Sheets

SUBSTRATE CARRIER

BACKGROUND OF THE INVENTION

The present invention relates to a substrate carrier for holding substrates, especially semiconductor wafers.

Substrate carriers for holding semiconductor wafers are known in the art. For example, with one such carrier, the wafer is held via a vacuum that is applied by a vacuum finger on a side of the wafer. With another form of a substrate carrier, a holding element is provided on the edge of the wafer. Although this substrate carrier can be put to many uses, there is a specialized application for which this type of substrate carrier is not suitable. Such a specialized use is, for example, a metal plating, especially a copper plating on one of the two surfaces of the wafer. With a metal plating of this type, the respective metal-containing treatment fluid is lead to the wafer surface to be plated, while a charge is applied between the wafer surface to be plated and an oppositely disposed anode. To produce this charge, it is necessary that the front side of the wafer to be plated be brought into electrical contact. An electrical contact on the backside of the wafer is therefore not possible, since the necessarily high current density for the plating on the front side of the wafer is not achievable by contacting the backside of the wafer without destroying any electronic structure in the wafer, for example transistors. Therefore, it is necessary to seal the surface of the wafer not to be treated against the copper in the treatment fluid, since metal in the area of the electronic structure can result in an undesired contamination. In particular, the electrical contacts for electrical contact of the front side of the wafer must also be protected from the electrolytes, since these electrolytes likewise can created an undesired metal layer.

The above-describe substrate carrier provides neither an electrical contact of the wafer surface to be treated nor a sealing of the non-treated surface against the treatment fluid.

In U.S. Pat. No. 5,429,733, a device for plating a wafer is disclosed in which the wafer is placed on a base portion with a central opening corresponding to the substrate shape, or as the case may be, on a seal disposed on the base portion. In order to securely hold the wafer, the wafer is pressed against the base portion or the seal with an inflatable balloon, which projects perpendicularly to the wafer surface. The seal comprises several undercuts in order to make possible an electrical contact with the surface of the wafer. Therefore, the undercut between the seal and the wafer is relatively large, which leads to a high damage to the margins or edges, since this area is sealed against any treatment. In addition, the interface between the seal and the wafer area creates a relatively neutral current when a fluid is flowed on the wafer, which leads to an non-homogeneous treatment of the wafer in this area.

U.S. Pat. No. 5,447,615 likewise shows a device in which the wafer is retained between a seal on a base portion and an inflatable balloon. An electrical contact of the wafer is accomplished through an opening in the seal portion which projects radially inward against the remaining seal.

In JP-A-7-211724, a device for plating a wafer is disclosed, in which the wafer is pressed by a substrate carrier against a seal lying on an upper edge of a treatment basin.

In contrast to the above described state of the art, the present invention addresses the task of providing a substrate carrier which permits, in a simple and reliable manner, sealing of a wafer surface to be treated while simultaneously allowing electrical contact of the surface to be treated, and one which allows a smaller undercut between the wafer and seal and a good flow of the treatment fluid in the area of the interface between the wafer and the seal.

SUMMARY OF THE INVENTION

The above task is resolved with the present invention which provides a substrate carrier for holding a substrate, especially a semiconductor wafer, having a first part and a second part, the second part having a central opening corresponding to the substrate shape, whereby the substrate is receivable between the first and second portions, and a peripheral seal is provided on the inner periphery of the second part and has at least one undercut. The peripheral seal on the inner periphery of the part having the central opening forms a radially inwardly extending boundary of the substrate carrier. On the basis of this peripheral seal, a good flow performance is achieved in the area of the interface between the wafer and the substrate when the substrate is washed with the treatment fluid. In addition, through the at least one undercut in the seal, an electrical contact of the surface of the wafer facing the central opening, outside of the surface of the wafer contacted with the treatment fluid, is possible.

Advantageously, the seal is formed by a sealing material applied to the inner periphery of the second part of the substrate carrier, which material is preferably welded or fused on in order to create a simple and inexpensive seal. Preferably, the sealing material overlaps a peripheral or edge area of the substrate in order to provide a reliable seal. Further, in this peripheral or edge area, an electrical contact of the substrate surface to be treated is made possible.

In a preferred form of the present invention, the seal has a sealing lip which is preferably constructed as a point or tip. The sealing lip, especially with a point or tip, provides the advantage of a good and defined seal and a defined transition between the wafer and the seal lip, which provides a uniform seal over time.

Preferably, the sealing lip is flush or joined with the inner periphery of the sealing material, that is, the sealing lip defines the most interior area of the sealing material in order to guarantee a uniform flow of the treatment fluid along the inner periphery of the sealing material.

In a particularly preferable embodiment of the present invention, the sealing lip is formed by a milling out of the sealing material. Upon applying sealing material to an inner periphery of the second part of the substrate carrier, in particular through fusing of the material, it is difficult to provide the necessary precision with regard to the shape and position of the sealing lip. For this reason, it is advantageous to mill out the sealing lip, or as the case may be, the entire shape of the seal first after applying the sealing material to the inner periphery of the second part of the substrate carrier, since then a higher precision of the shape and arrangement of the seal, in particular the sealing lip, can be achieved.

Preferably, the sealing material comprises polymeric material and is elastic. In this regard, the elasticity should not be too high so that the seal provides a sufficient pressure and a good seal against the wafer.

With another particularly advantageous embodiment of the present invention, an elastic element opposite the seal is provided on the first part of the substrate carrier, in order to create the necessary contact pressure and to balance the minimal elasticity of the sealing material. Through the elastic element, the substrate is pressed against the relatively rigid seal in order to prevent damage to the wafer from the seal. Therefore, the elastic element preferably lies opposite the sealing lip in order to sufficiently press the substrate in this area elastically against the point or tip of the sealing lip, thereby providing a good seal. For a simple and inexpensive solution, the elastic element is an O-ring. Preferably, the elastic element is held in a channel, especially a dovetail channel, in the first part of the substrate carrier to fix the position of the elastic element. The dovetail channel is particularly advantageous since, on the one hand, it offers a good fixing of the O-ring and, on the other hand, it allows a lateral extension of the O-ring.

According to a particularly preferred embodiment of the present invention, at least one centering element is provided on the second part of the substrate carrier. The centering element determines the position of the substrate with regard to the sealing, as well as the position of the first and second parts of the substrate carrier relative to one another, in order to provide a uniform operation of the seal. Preferably, the at least one centering element includes a bevel or slant along which a sliding centering can be performed. Preferably, several centering elements define an inner periphery which essentially corresponds to the outer periphery of the substrate in order to prevent lateral movement of the substrate during treatment, and to enable a simultaneous and precise placement of the seal. According to a preferred embodiment of the present invention, the centering element is constructed as a one-piece unit with the sealing material and is milled out from the sealing material, whereby an inexpensive manufacturing of the centering element is made possible. In addition, milling out of the sealing material provides the advantage that high precision can be maintained.

In another embodiment of the present invention, at least one centering element is provided in the first part of the substrate carrier in order to reliably determine the centering of the first and second parts of the substrate carrier. Therefore, the centering element on the first part of the substrate preferably has a bevel or slant, which lies opposite the bevel of the centering element on the second part and therefore is complementary thereto, in order to enable a simple way of centering the two parts. Preferably, the channel which receives the elastic element delimits the centering element.

In order to guarantee an electrical contact of the surface of the substrate, the substrate carrier has a contact assembly or arrangement. For contacting the front side of the substrate, on which the seal lies, the contact arrangement is preferably disposed on the second part of the substrate holder. Therefore, the contact arrangement projects into the area of the undercut in the seal in a particularly advantageous embodiment of the present invention.

For a good and reliable electrical contact of the substrate surface, the contact arrangement has at least one contact spring, which is biased in the direction of the substrate, and thereby reliably ensures good contact upon vibration or minimal movement of the substrate. Preferably, a plurality of contact springs are constructed by cut-outs in a ring-shaped contact member, in order to provide, in a simple and cost-effective manner, a uniform electrical contact over an outer periphery of the substrate.

With another preferred embodiment of the present invention, at least one chamber is formed between the first and second parts of the substrate carrier, and preferably serves to receive the contact arrangement. Preferably, the first chamber extends around the central opening of the substrate carrier, so that the first chamber is ring-shaped with a round substrate or angular with an angular substrate. In one embodiment, an inner periphery of the first chamber is sealed by the elastic element on the first part of the substrate carrier, by the substrate, and by the seal on the second part of the substrate carrier. An outer periphery of the first chamber is sealed by at least one sealing element on the first and/or second parts of the substrate carrier. In this regard, the sealing element for a good and cost-effective sealing is an O-ring.

According to a further preferred embodiment of the present invention, at least one second chamber is provided between the first and second parts of the substrate carrier. The second chamber preferably extends around the first chamber, and includes at least one sealing element on the first and/or second parts of the substrate carrier for sealing the second chamber. Advantageously, two sealing elements for sealing the second chamber are provided, which preferably are O-rings.

For holding together the first and second parts of the substrate holder, preferably a device for applying a vacuum to the first and/or second chamber is provided. With a vacuum, the first and second parts can be held against one another in a simple manner and by releasing the vacuum, the first and second parts can be easily separated from one another, in order, for example, to grasp the substrate held between the two parts.

To stabilize the sealing lip, the first chamber can be advantageously filled with a fluid, for example $N_2$, in order to create a counter pressure to the pressure of the treatment fluid acting on the sealing lip. In order to prevent a bending or deformation of the substrate during treatment, a substrate support surface is provided on the first portion of the substrate carrier for the side of the substrate which is not to be treated, which support surface essentially has the same shape as the substrate.

The first and second parts of the substrate carrier preferably each have a metal body, in order to provide the substrate carrier with the necessary rigidity and strength. Each respective metal body is provided with a coating of polymeric material to prevent contact between metal-based contaminants and the substrate, or, as the case may be, to prevent contact between the metal-attaching treatment fluid and the metal body. Preferably, the coatings have areas with varying thicknesses, in order to allow for the forming of the above-described channels, chambers and the like.

BRIEF DESCRIPTION OF THE DRAWINGS

The invention is explained below with reference to the figures.

The figures show

DESCRIPTION OF PREFERRED EMBODIMENTS

Figure 1:
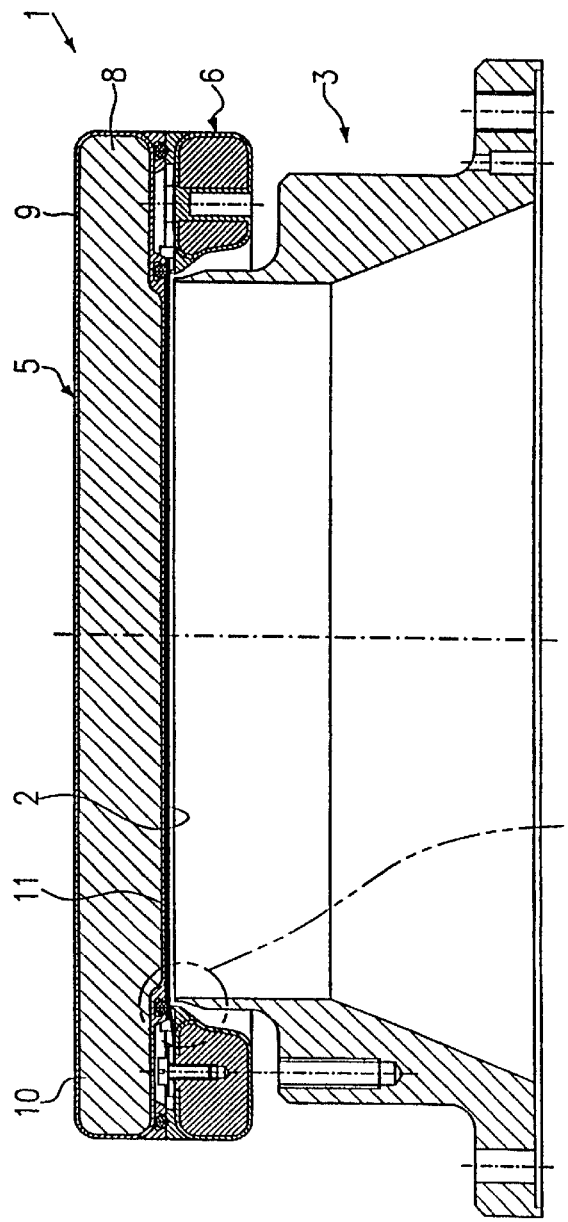
FIG. 1 a schematic sectional view of a substrate carrier of the present invention, which is arranged over a treatment or processing device.

FIG. 1 shows schematically in cross section a substrate carrier 1, which holds a wafer 2 and is disposed above a processing or treatment device 3. The treatment device 3 is a metal plating device, such as a copper plating device, which supplies a metal-containing treatment fluid from below to the wafer 2. A current is thereby created between the anode arrangement (not shown) on the treatment device 3 and a surface of the substrate to be treated by the treatment device.

In order to avoid repetition with regard to the construction of the metal plating device 3, reference is made to the Applicant's patent application with the application Ser. No. 09/869,213 and the title "Device and Method for Processing Substrates", which was filed on the same day as the present application, and to which reference is made to the extent that it corresponds to the subject matter of the present invention.

The substrate carrier 1 comprises an upper or top cover 5 and a lower ring 6, and the substrate 2 is retained between the cover 5 and the ring element 6, as will be described below in greater detail.

The cover 5 has a metal body 8, which is coated with a polymeric material coating 9. The top side 10 of the metal body 8 is smooth and level, and an underside 11 is stepped so that the metal body 8 has a greater thickness in a central region, which essentially corresponds to the shape of the wafer 2, than in a peripheral region of the metal body 8.

The coating 9 has an essentially uniform thickness on the upper surface and on the sides of the metal body 8. On the underside of the metal body 8, the coating in the peripheral or edge region, that is in the area where the metal body 8 has a smaller thickness, is at least partially thicker, as is shown in the Figure. Alternatively, the coating 9 could have a uniform thickness over the entire metal body 8, and supplementary material could be secured, for instance by welding, on the coating in the peripheral region of the metal body.

Figure 2:
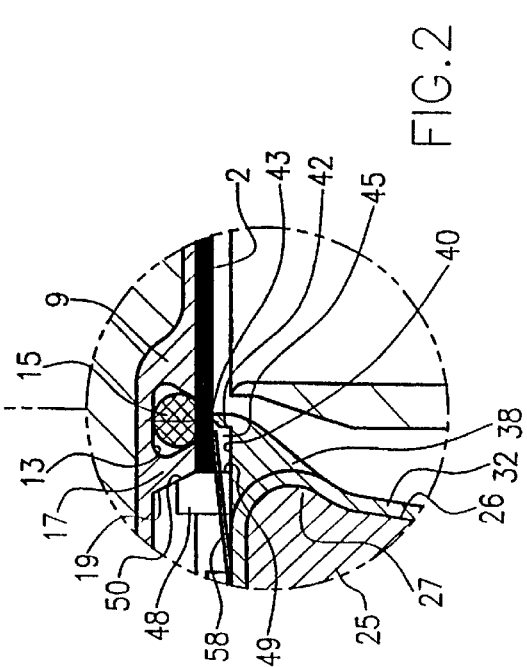
FIG. 2 a detail view of an inventive sealing arrangement of the substrate carrier of the present invention.
Figure 3:
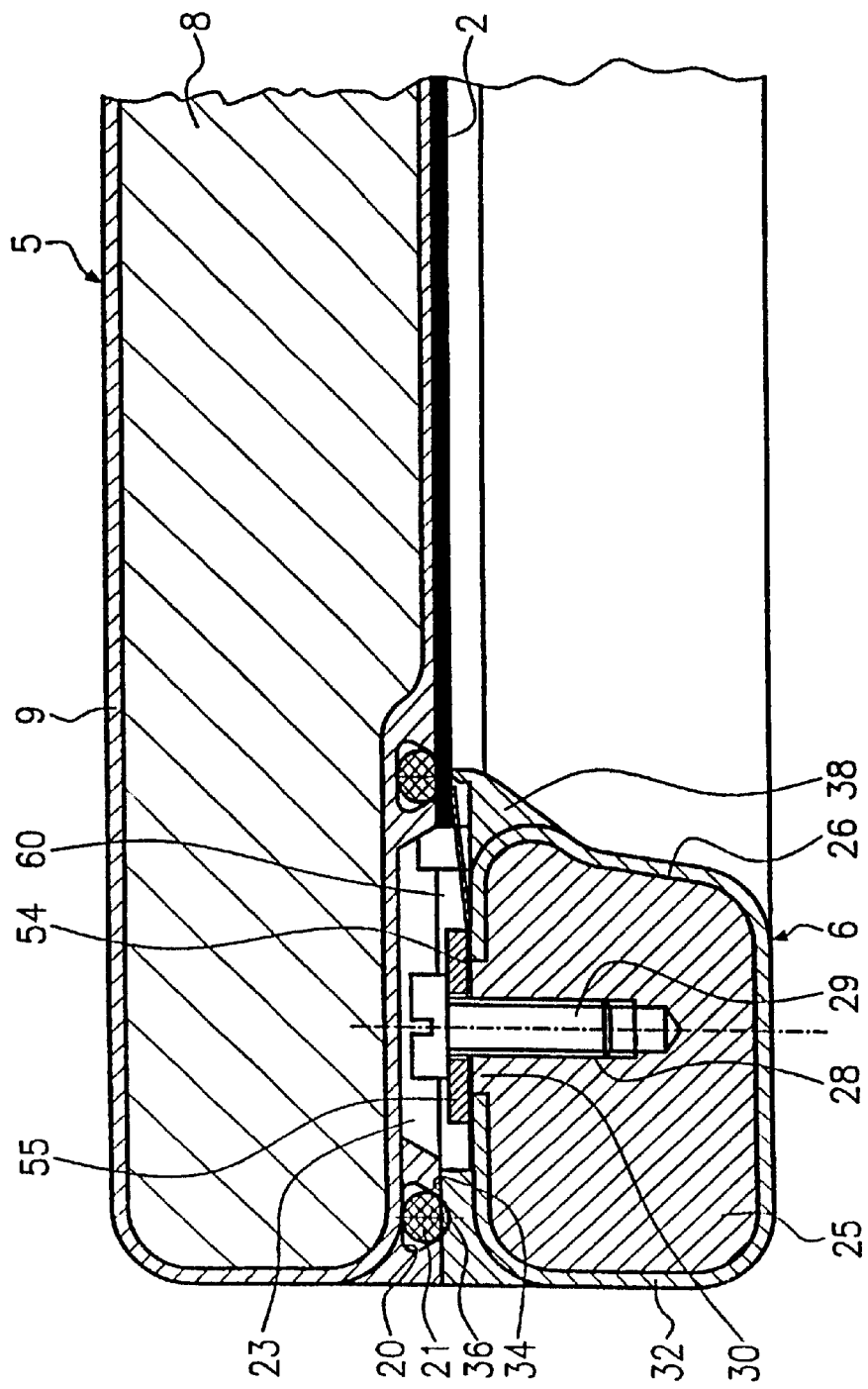
FIG. 3 an enlarged partial view of an area of the substrate carrier according to FIG. 1.

A first area, in which the coating 9 is more thickly applied, lies where the metal body 8 goes from a first thickness to a second thickness, as best shown in FIG. 2. In the coating 9 in this area, a dovetail channel 13 is formed, in which the O-ring 15 is received. The dovetail channel 13 can be milled out of the material which forms the coating 9, following the coating of the metal body 8. Alternatively, the dovetail channel can be constructed in this shape also during the coating of the metal body. Adjacent to the dovetail channel 13, the material of the coating 9 forms a step or leg 17 with a bevel or inclined surface 19 which projects slopingly inward, as shown in FIG. 2. A second area, in which the coating 9 is more thickly formed, is found on the edge of the cover 5, as best seen in FIG. 3. In this area, a dovetail channel 20 is formed, in which an O-ring 21 is disposed. Between the first and second thicker regions of the coating 9, a chamber 23, opening downwardly, is formed, which extends over the entire periphery of the cover.

The lower ring 6 of the substrate carrier 1 has a ring-shaped metal body 25 with an essentially right-angled cross section with rounded edges. An inner side 26 of the metal body 25 is somewhat slanted, and has an upwardly tapered inner periphery. In an upper area of the inner side 26, a small projection 27 is provided, which forms a rounded edge of the metal body 25. The metal body 25 has threaded bores 28 in a top surface for receiving screws 29 in order to secure a contact arrangement on the ring 6, as will be described below. In the area of the threaded bores 28, the metal body has an elevated projection 30.

The metal body 25 is almost completely encased by a coating 32, with the exception of the projection 30. The coating 32 is made from the same material as the coating 9, although this is not mandatory.

The coating 32 is more thickly formed on an outer, upper edge of the ring 6, in order to provide an elevated support 34 for the cover 5. In the elevated support 34, a recess 36 is provided, into which the O-ring on the cover 5 projects when the cover 5 and the ring 6 are in contact.

On an inner, upper edge of the ring, a sealing material 38 is applied that, for example, is welded onto the coating 32. Alternatively, the sealing material 38 could be made from the same material as the coating 32 and could be of unitary, one-piece construction with the coating. The sealing material 38 extends from the ring 6 radially inward. A top surface 40 of the sealing material 38 is formed to be aligned with a top side, or upper surface, of the coating 32, as best seen in FIG. 2. The sealing material extends around the entire inner periphery of the ring 6 and overlaps a peripheral or edge region of the wafer 2 in a lateral direction, as best shown in FIG. 2. In the sealing material 38, a sealing lip 42 is formed perpendicular to the top surface 40, and terminates in a point or tip 43. Thereby, the sealing lip terminates, or is flush, with the inner periphery of the sealing material, that is, the sealing lip 42 overlaps the wafer 2 furthest. In an area, which lies radially outside of the sealing lip 42, the sealing material 38 for construction of the top surface 40 is cut out, in order to form a free chamber 45 between the sealing material and the peripheral or edge region of the wafer 2. The lateral overlapping of the sealing material 38 with the wafer 2 averages 3 mm, that is, an edge or peripheral region of 3 mm is sealed off from the treatment fluid coming from the treatment device 3 onto the wafer. This distance can, however, also be changed to two or even one millimeter or some other value, whereby it must be guaranteed that between the wafer 2 to be processed and the sealing material 38, an essentially free chamber 45 remains in which an electrical contact of a surface of wafer to be treated takes place, as will be described below. This so-called peripheral connection is necessary in order to prevent copper from being applied to the backside of the wafer 2 during plating of the top side of the wafer, while simultaneously enabling an electrical contact of the wafer surface to be plated. An electrical contact on the backside of the wafer is not possible, since the high current density for the plating process cannot be achieved on the backside of the wafer, without destroying any electronic components, such as transistors, in the wafer. Therefore, it should be noted that on the plated topside of the wafer, a thin layer of a suitable metal is applied, which for example can be sprayed on, in order to make possible the necessary current flow, i.e. the high current density, for the plating process.

The sealing lip lies concentrically about a central point of the wafer, in order to provide a uniform peripheral connection. In this regard, the sealing lip 42 lies opposite the O-ring 15 on the cover 5 in such a manner that the O-ring force is sufficiently directed onto the point or tip of the sealing lip when the wafer 2 is retained between the O-ring 15 and the sealing lip 42.

In addition, the sealing material 38 forms a plurality of projections 48, which are arranged radially outward, relative to the sealing lip 42, and which are higher than the sealing lip 42. Each projection 48 includes a bevel or inclined surface 50 in an upper area of a side 49 facing a central point of the device, with each bevel tapering downwardly. In a lower area, the inwardly facing side 49 of the projections 48 is linearly formed. The linear areas of the side 49 of the projections 48 define an inner periphery, which corresponds to an outer periphery of a wafer 2. Via the bevel 50, a wafer 2 placed on the ring can be centered relative to the ring and, by the straight sections of the sides 49, can be held against lateral shifting. The bevels 50 of the projections 48, additionally, are complementary to the bevels 19 of the cover 5, in order to also provide a centering of the cover 5 relative to the ring 6.

A metal ring 54 is screwed onto the lower ring 6 via screws 29. Between the metal ring 54 and a head of the screw 29, a reinforcing ring 55 is provided. The metal ring 54 is directly attached, or attached via the metal body 25, with a device for applying a voltage, which is not specifically represented in the Figure. The metal ring 54 has cutouts in a middle area for the formation of spring elements 58 thereon, one of which is represented in FIG. 2. As can be seen in FIG. 2, the spring element 58 projects into the chamber 45 constructed through the cutouts in the sealing material 38 between the sealing material 38 and the wafer 2. The spring elements 58, opposite an outer area, in which the attachment to the metal body 25 takes place, are bent upwardly, and indeed are arranged such that they project in an unstressed state over the points or tips 43 of the sealing lip 42. When a wafer 2 is placed from above on the ring 6, the underside of the wafer 2 comes into contact with the spring element 58, which springs downwardly, and thereby ensures a good contact with the underside of the wafer 2. Although this feature is not shown in the FIGS., a rounded contact arch may be formed in the spring element 58 in the area in which contact of the wafer 2 takes place, in order to prevent damage to the contacted wafer surfaces.

When the cover 5 is constructed as shown in FIG. 3, an intermediate chamber 60 is formed, with the wafer 2 on the lower ring 6 lying therebetween, to which a vacuum can be applied via a device (not represented), in order to hold the ring 6 on the cover 5. The chamber 60 is thereby sealed on the outer periphery by the O-ring 21 and on the inner periphery by the sealing lip 42, the O-ring 15, as well as the securely held wafer 2 therebetween. The ring 6, however, can also be held on the cover 5 in any other suitable manner and method.

For loading and unloading, the ring 6 is placed on a support (not shown), the vacuum is removed from the chamber 60 and the cover 5 is lifted relative to the ring 6. In this position, a wafer-manipulating robot can grasp the wafer 2 from between the cover 5 and the ring 6 through a gap formed between the cover 5 and the ring 6, lift the wafer over the projections 48, and laterally move the wafer from the substrate carrier. Upon loading, the wafer-handling robot guides the wafer 2 from one side through a gap between the cover 5 and the ring 6 and lays the wafer 2 on the ring 2. Should the wafer 2 not be precisely centered relative to the ring 6, then centering takes place via the bevels 50 on the projections 48. The wafer 2 comes into contact with the spring elements 58. Subsequently, the wafer-handling robot moves out of the area between the cover 5 and the ring 6, and lowers the cover 5. The cover 5 is thereby centered relative to the ring via the bevels 15 and 19. The wafer 2 is then pressed by the O-ring 15 securely against the point 43 of the sealing lip 42 to achieve a good sealing effect. The O-ring 21 engages the recesses 36, which also provide a good sealing effect. Subsequently, a vacuum is applied once again to the chamber 60 so that the ring 6 is held securely on the cover 5 and the ring 6 and cover 5 can be transported over the treatment device 3.

Figure 4:
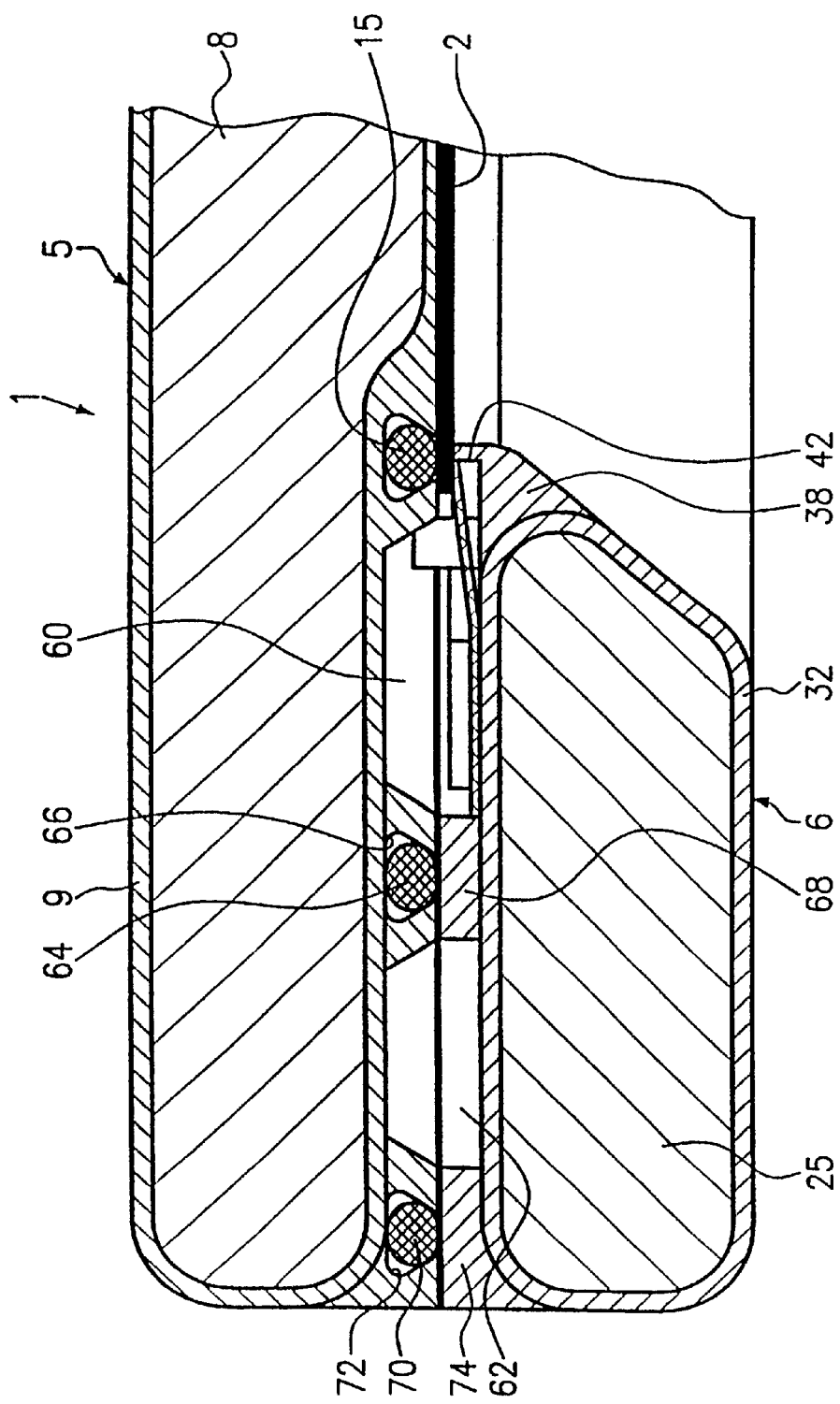
FIG. 4 an enlarged partial view similar to the view of FIG. 3, which shows a second embodiment of a substrate carrier of the present invention.

FIG. 4 shows an alternative embodiment of a substrate carrier 1.

With the embodiment according to FIG. 4, the same reference numerals have been used to indicate the same parts described above with reference to the other embodiment. The substrate carrier 1 according to FIG. 4 has a cover 5 and a lower ring 6, each of which has a metal body 8 or 25. As with the first embodiment, the metal body 8 and the metal body 25 are covered with a coating 9 or 32.

The main differences between the substrate carrier of FIGS. 1–3 and the substrate holder of FIG. 4 are that the cover 5 and the ring 6 according to FIG. 4 have a larger diameter, and a further chamber 62 is formed between the top cover 5 and the lower ring 6. This chamber 62 extends radially outward relative to the chamber 60. The chambers are thereby sealed from one another by an O-ring 64, which is disposed in a dovetail channel 66 formed in the coating 9. If the upper portion 5 is placed on the lower ring 6, the O-ring 64 presses against a raised portion 68 of the coating 32 in order to seal the chambers 60 and 62 from one another. An inner periphery of the chamber 60 is sealed in a similar manner as described with reference to the first embodiment, that is, through the O-ring 15, the wafer 2, and the sealing lip 42.

An outer periphery of the chamber 62 is sealed through an O-ring 70, which is disposed in a dovetail channel 72 of the coating 9 and is pressed against a raised portion 74 of the coating 32 in a closed state of the substrate carrier 1.

Via a device not shown in the Figures, a vacuum can be applied to the chamber 62 in order to secure the lower ring 6 on the top cover 5.

The advantage of using a second chamber 62, to which a vacuum can be applied, lies in the fact that the vacuum applied to the chamber 62 does not work on the sealing lip 42, in contrast to the vacuum applied to the chamber 60. Therefore, interference with the sealing action of the sealing lip 42 on the wafer 2 can be avoided.

Although the present invention has been described with reference to particular embodiments, the substrate carrier is not limited to the specialized forms herein represented. For example, instead of the device for applying the vacuum, for holding the lower ring 6 on the cover 5 a magnet arrangement, especially an electromagnetic arrangement, can be provided for securely holding the lower ring 6 on the upper cover. It is also possible to provide a mechanical holding device, for example, a clamping device, in order to hold the cover 5 and the lower ring 6 together. Although the cover 5 is designated as an upper or top cover and the ring 6 as a lower ring 6, the substrate carrier can be used in any direction, for example, vertically or also in a direction rotatable about 180°. The substrate carrier is applicable for rounded as well as angular substrates, that is, substrates having any shape, whereby the shape of the lower ring, as well as the shape of the cover, can conform to the shape of the substrates. The lower ring can therefore also comprise an angular shape with an angular central opening. In the same manner, the chambers formed between the cover and the lower ring can also have various shapes.

The specification incorporates by reference the disclosure of German priority documents 198 59 487.4 of Dec. 22, 1998 and PCT/EP99/09942 of Dec. 15, 1999.

The present invention is, of course, in no way restricted to the specific disclosure of the specification and drawings, but also encompasses any modifications within the scope of the appended claims.

What is claimed is:

1. A substrate carrier for holding a substrate, comprising:
   a first part;
   a second part, wherein a substrate is receivable between said first and second parts, and wherein said second part has a central opening corresponding to the shape of the substrate; and
   a peripheral seal provided on an inner periphery of said second part, wherein said peripheral seal forms an inner surface or contour that widens in a direction away from the substrate, wherein said peripheral seal has at least one undercut, and wherein said peripheral seal is formed of elastic, polymeric sealing material that is applied to said inner periphery of said second part.

2. A substrate carrier according to claim 1, wherein said sealing material overlaps an edge region of the substrate.

3. A substrate carrier according to claim 2, wherein said seal is provided with a sealing lip.

4. A substrate carrier according to claim 3, wherein said sealing lip forms a tip.

5. A substrate carrier according to claim 3, wherein said sealing lip is flush with an inner periphery of said sealing material.

6. A substrate carrier according to claim 3, wherein said sealing lip is formed by a milled-out portion of said sealing material.

7. A substrate carrier according to claim 3, wherein said first part of said substrate carrier is provided with an elastic element that is disposed opposite said seal.

8. A substrate carrier according to claim 7, wherein said elastic element is opposite said sealing lip.

9. A substrate carrier according to claim 7, wherein said elastic element is held in a channel of said first part of said substrate carrier.

10. A substrate carrier according to claim 1, wherein said second part of said substrate carrier is provided with at least one centering element.

11. A substrate carrier according to claim 10, wherein said centering element is provided with an inclined surface.

12. A substrate carrier according to claim 11, wherein said first part of said substrate carrier is provided with at least one centering element.

13. A substrate carrier according to claim 12, wherein said at least one centering element on said first part of said substrate carrier is provided with an inclined surface.

14. A substrate carrier according to claim 13, wherein said inclined surfaces of said centering elements of said first and second parts are disposed opposite one another and are complementary to one another.

15. A substrate carrier according to claim 12, wherein said first part of said substrate carrier is provided with channel for an elastic element, and wherein said centering element of said first part borders said channel.

16. A substrate carrier according to claim 10, wherein a plurality of centering elements are provided and define an inner periphery, that essentially corresponds to an outer periphery of the substrate.

17. A substrate carrier according to claim 10, wherein said centering element is monolithic with said sealing material.

18. A substrate carrier according to claim 1, which includes at least one contact arrangement for electrically contacting a surface of the substrate.

19. A substrate carrier according to claim 18, wherein said contact arrangement is disposed on said second part of said substrate carrier.

20. A substrate carrier according to claim 18, wherein said contact arrangement extends at least partially into the area of said at least one undercut of said seal.

21. A substrate carrier according to claim 18, wherein said contact arrangement is provided with at least one contact spring.

22. A substrate carrier according to claim 21, wherein said contact spring is biased in a direction toward said substrate.

23. A substrate carrier according to claim 21, wherein a plurality of contact springs are provided and are formed by cutouts in a ring-shaped contact member.

24. A substrate carrier according to claim 1, wherein at least one first chamber is formed between said first and second parts of said substrate carrier.

25. A substrate carrier according to claim 24, wherein said at least one first chamber extends about said central opening of said second part.

26. A substrate carrier according to claim 24, wherein an inner periphery of said first chamber is sealed by an elastic element on said first part of said substrate carrier, by the substrate, and by said seal on said second part of said substrate carrier.

27. A substrate carrier according to claim 24, wherein an outer periphery of said first chamber is sealed by at least one sealing element disposed on at least one of said first second parts of said substrate carrier.

28. A substrate carrier according to claim 24, wherein at least one second chamber is formed between said first and second parts of said substrate carrier.

29. A substrate carrier according to claim 28, wherein said second chamber extends about said first chamber.

30. A substrate carrier according to claim 28, wherein at least one sealing element is provided on at least one of said first and second parts of said substrate carrier for sealing said second chamber.

31. A substrate carrier according to claim 30, wherein two sealing elements are provided for sealing said second chamber.

32. A substrate carrier according to claim 28, which includes means for applying a vacuum to at least one of said first and second chamber.

33. A substrate carrier according to claim 1, wherein said first part of said substrate carrier is provided with a substrate support surface.

34. A substrate carrier according to claim 33, wherein said substrate support surface essentially conforms to the shape of the substrate.

35. A substrate carrier according to claim 1, wherein said first part of said substrate carrier is provided with a metal body.

36. A substrate carrier according to claim 35, wherein said metal body is provided with a coating.

37. A substrate carrier according to claim 36, wherein portions of said coating have different thicknesses.

38. A substrate carrier according to claim 36, wherein said second part of said substrate carrier is provided with a metal body.

39. A substrate carrier according to claim 38, wherein said metal body of second part is provided with a coating.

40. A substrate carrier according to claim 39, wherein portions of said coating have different thicknesses.

41. A substrate carrier according to claim 39, wherein said coatings of said first and second parts comprise polymeric material.

* * * * *